(12) United States Patent
Jeon et al.

(10) Patent No.: US 7,402,492 B2
(45) Date of Patent: Jul. 22, 2008

(54) METHOD OF MANUFACTURING A MEMORY DEVICE HAVING IMPROVED ERASING CHARACTERISTICS

(75) Inventors: Sang-hun Jeon, Seoul (KR); Kyu-sik Kim, Suwon-si (KR); Chung-woo Kim, Suwon-si (KR); Sung-ho Park, Seongnam-si (KR); Yo-sep Min, Yongin-si (KR); Jeong-hee Han, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 128 days.

(21) Appl. No.: 11/385,642

(22) Filed: Mar. 21, 2006

(65) Prior Publication Data

US 2006/0211205 A1    Sep. 21, 2006

(30) Foreign Application Priority Data

Mar. 21, 2005    (KR) .................. 10-2005-0023294

(51) Int. Cl.
*H01L 21/336* (2006.01)
(52) U.S. Cl. .................. 438/257; 438/200; 438/201; 438/258; 438/264; 438/265; 438/287; 438/296; 257/E21.21
(58) Field of Classification Search .................. 438/201, 438/265
See application file for complete search history.

(56) References Cited

U.S. PATENT DOCUMENTS

| 6,642,573 | B1 | 11/2003 | Halliyal et al. | 257/316 |
| 2003/0047755 | A1 | 3/2003 | Lee et al. | 257/200 |
| 2003/0211692 | A1 | 11/2003 | Lee | 438/258 |
| 2006/0160303 | A1* | 7/2006 | Ang et al. | 438/257 |

FOREIGN PATENT DOCUMENTS

| KR | 10-2003-0086825 | 11/2003 |
| KR | 10-2004-0046341 | 6/2004 |

* cited by examiner

*Primary Examiner*—Michael S. Lebentritt
*Assistant Examiner*—Kyoung Lee
(74) *Attorney, Agent, or Firm*—Mills & Onello, LLP

(57) ABSTRACT

In a method of manufacturing a memory device having improved erasing characteristics, the method includes sequentially forming a tunneling oxide layer, a charge storing layer, and a blocking oxide layer on a semiconductor substrate; annealing the semiconductor substrate including the tunneling oxide layer, the charge storing layer, and the blocking oxide layer under a gas atmosphere so that the blocking oxide layer has a negative fixed oxide charge; forming a gate electrode on the blocking oxide layer with the negative fixed oxide charge and etching the tunneling oxide layer, the charge storing layer, and the blocking oxide layer to form a gate structure; and forming a first doped region and a second doped region in the semiconductor substrate at sides of the gate structure by doping the semiconductor substrate with a dopant.

10 Claims, 6 Drawing Sheets

METHOD OF MANUFACTURING A MEMORY DEVICE HAVING IMPROVED ERASING CHARACTERISTICS

CROSS-REFERENCE TO RELATED PATENT APPLICATION

This application claims priority to Korean Patent Application No. 10-2005-0023294, filed on Mar. 21, 2005, in the Korean Intellectual Property Office, the disclosure of which is incorporated herein in its entirety by reference.

BACKGROUND OF THE INVENTION

1. Field of the Invention

The present invention relates to a method of manufacturing a memory device having improved erasing characteristics, and more particularly, to a method of manufacturing a memory device in which an atmospheric gas and an annealing temperature are controlled so that a blocking oxide layer can maintain a negative voltage during a process for forming the memory device.

2. Description of the Related Art

The development of semiconductor memory devices has focused on increasing storage capacity while, at the same time, increasing programming and erasing speeds. A typical semiconductor memory array structure includes a plurality of memory unit cells connected by circuitry and can be classified as a non-volatile memory device in which information is retained when the power removed or as a volatile memory device such as a dynamic random access memory (DRAM) in which information is retained only while power is applied. The information storage capacity of the memory device is proportional to the integration density of the memory device. A typical unit cell of a semiconductor memory device includes one transistor and one capacitor.

Recently, new types of semiconductor memory devices having new operation principles have been introduced. For example, semiconductor memory devices having a giant magneto-resistance (GMR) structure or a tunneling magneto-resistance (TMR) structure formed on a transistor have been introduced to utilize magnetic resistance characteristics. Also, new structures of non-volatile semiconductor memory devices, such as a phase change random access memory (PRAM) that utilizes a phase change material to provide a data storage function, and a SONOS device having a tunneling oxide layer, a change storing layer, and a blocking oxide layer, have been introduced.

Figure 1:
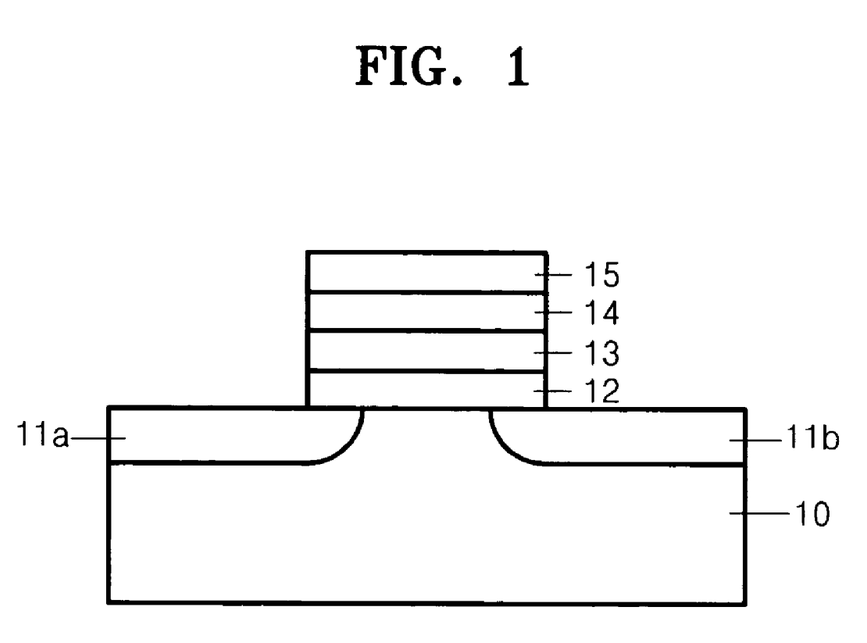
FIG. 1 is a cross-sectional view of a conventional memory device.

FIG. 1 is a cross-sectional view of a typical conventional SONOS memory device. Referring to FIG. 1, a first doped region 11a and a second doped region 11b doped with a dopant are formed in a semiconductor substrate 10. A channel region is defined in the semiconductor substrate 10 between the first and second doped regions 11a and 11b. A gate structure is formed on the semiconductor substrate 10 contacting the first doped region 11a and the second doped region 11b. The gate structure has a structure in which a tunneling oxide layer 12, a charge storing layer 13, a blocking oxide layer 14, and a gate electrode layer 15 formed of a conductive material are sequentially formed.

Here, the tunneling oxide layer 12 contacts the first doped region 11a and the second doped region 11b of the semiconductor substrate 10, and charge flowing in the channel region is stored in a trap site of the charge storing layer 13 after the electrons pass through the tunneling oxide layer 12. That is, the information programming of the memory device having the above structure is performed when the electrons pass through the tunneling oxide layer 12 under a voltage applied to the memory device and are trapped in the trap site of the charge storing layer 13.

In the SONOS memory device, the device threshold voltage $V_{th}$ varies depending on whether the electrons are trapped in the charge storing layer 13. The blocking oxide layer 14 on the charge storing layer 13 blocks electrons from leaking into the gate electrode layer 14 while the electrons are trapped in the trap site of the charge storing layer 13, and blocks charge of the gate electrode layer 14 from being injected into the charge storing layer 13.

The SONOS memory device requires a thin tunneling oxide layer 15 to increase the programming and erasing speed. However, this in turn reduces the information retention characteristics of the device. That is, the retention characteristics and erasing characteristics are in a mutual trade-off relationship in accordance with the thickness of the tunneling oxide layer 12. To improve the inverse proportional relationship between the retention characteristics and the erasing characteristics, control over the characteristics of the blocking oxide layer 14 is needed.

However, to prevent the blocking oxide layer 14 from tunneling electrons from the gate electrode layer 15, a thick blocking oxide layer 14 is desired. However, if the blocking oxide layer 14 is too thick, then control of the characteristics of the channel region by the gate electrode layer 15 is adversely affected.

SUMMARY OF THE INVENTION

The present invention provides a method of manufacturing a semiconductor memory device with an improved memory erasing speed while maintaining the retention characteristics of a SONOS memory device or a floating gate type memory device.

In one aspect, the present invention is directed to a method of manufacturing a memory device, comprising: sequentially forming a tunneling oxide layer, a charge storing layer, and a blocking oxide layer on a semiconductor substrate; annealing the semiconductor substrate including the tunneling oxide layer, the charge storing layer, and the blocking oxide layer under a gas atmosphere so that the blocking oxide layer has a negative fixed oxide charge; forming a gate electrode on the blocking oxide layer with the negative fixed oxide charge and etching the tunneling oxide layer, the charge storing layer, and the blocking oxide layer to form a gate structure; and forming a first doped region and a second doped region in the semiconductor substrate at sides of the gate structure by doping the semiconductor substrate with a dopant.

In one embodiment, the gas atmosphere for annealing comprises an element selected from the group consisting of N, O, F, Si, P, S, Cl, C, As, Se, Br, Te, I, and At.

In another embodiment, the gas atmosphere for annealing is one selected from $O_2$, $RuO$, and $NH_3$.

In another embodiment, the annealing is performed at a temperature of 650° C. or more.

In another embodiment, the annealing is performed at a temperature in the range of 700 to 1000° C.

In another aspect, the present invention is directed to a method of manufacturing a memory device, comprising: sequentially forming a tunneling oxide layer, a charge storing layer, a blocking oxide layer, and a gate electrode layer on a semiconductor substrate; etching the tunneling oxide layer, the charge storing layer, the blocking oxide layer, and the gate electrode layer to form a gate structure; forming a first doped region and a second doped region in the semiconductor substrate at sides of the gate structure by doping the semiconductor substrate with a dopant; and annealing the semiconductor substrate and the gate structure under a gas atmosphere so that the blocking oxide layer has a negative fixed oxide charge;

In one embodiment, the gas atmosphere for annealing comprises an element selected from the group consisting of N, O, F, Si, P, S, Cl, C, As, Se, Br, Te, I, and At.

In another embodiment, the gas atmosphere for annealing is one selected from $O_2$, RuO, and $NH_3$.

In another embodiment, the annealing is performed at a temperature of 650° C. or more.

In another embodiment, the annealing is performed at a temperature in the range of 700 to 1000° C.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF EMBODIMENTS OF THE INVENTION

The present invention will now be described more fully with reference to the accompanying drawings, in which exemplary embodiments of the invention are shown. In the drawings, the thicknesses of layers and regions are exaggerated for clarity.

Figure 2A:
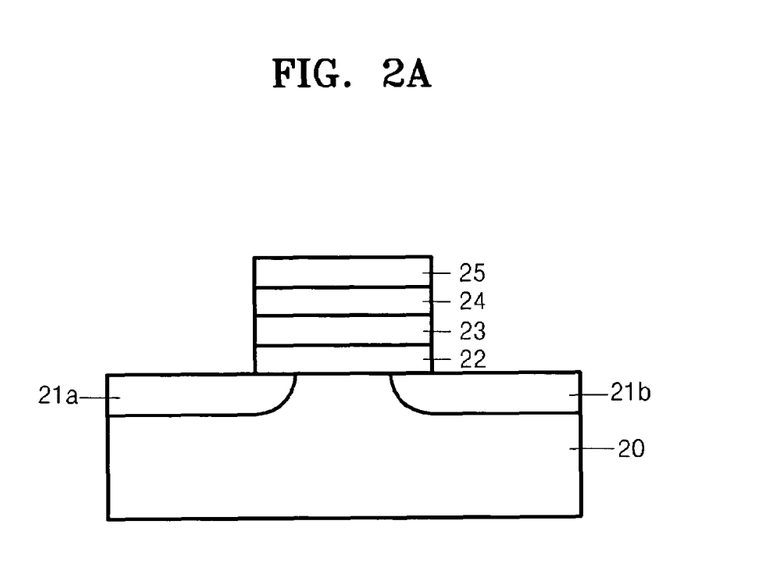
FIG. 2A is a cross-sectional view illustrating the structure of a memory device according to an embodiment of the present invention.

FIG. 2A is a cross-sectional view illustrating the structure of a memory device having improved erasing characteristics according to an embodiment of the present invention.

Referring to FIG. 2A, a semiconductor substrate 20 having a first doped region 21a and a second doped region 21b doped with a dopant is provided. A gate structure is formed on the semiconductor substrate 20 between the first and second doped regions 21a and 21b. The gate structure includes a tunneling oxide layer 22, a charge storing layer 23 that includes a trap site for trapping charges, a blocking oxide layer 24, and a gate electrode layer 25, sequentially formed on the semiconductor substrate 20.

The tunneling oxide layer 22 can be formed of an insulating material, such as $SiO_2$, used for forming a conventional memory device. The charge storing layer 23 includes a trap site for trapping charge passed through the tunneling oxide layer 22 from a channel region of the semiconductor substrate 20, and is formed of a high-k material having a dielectric constant greater than that of the tunneling oxide layer 22 and the blocking oxide layer 24.

The gate electrode layer 25 can be formed of any conductive material used for forming a conventional semiconductor memory device. The blocking oxide layer 24 can have a negative fixed oxide charge which will be described with reference to FIG. 2B.

Figure 2B:
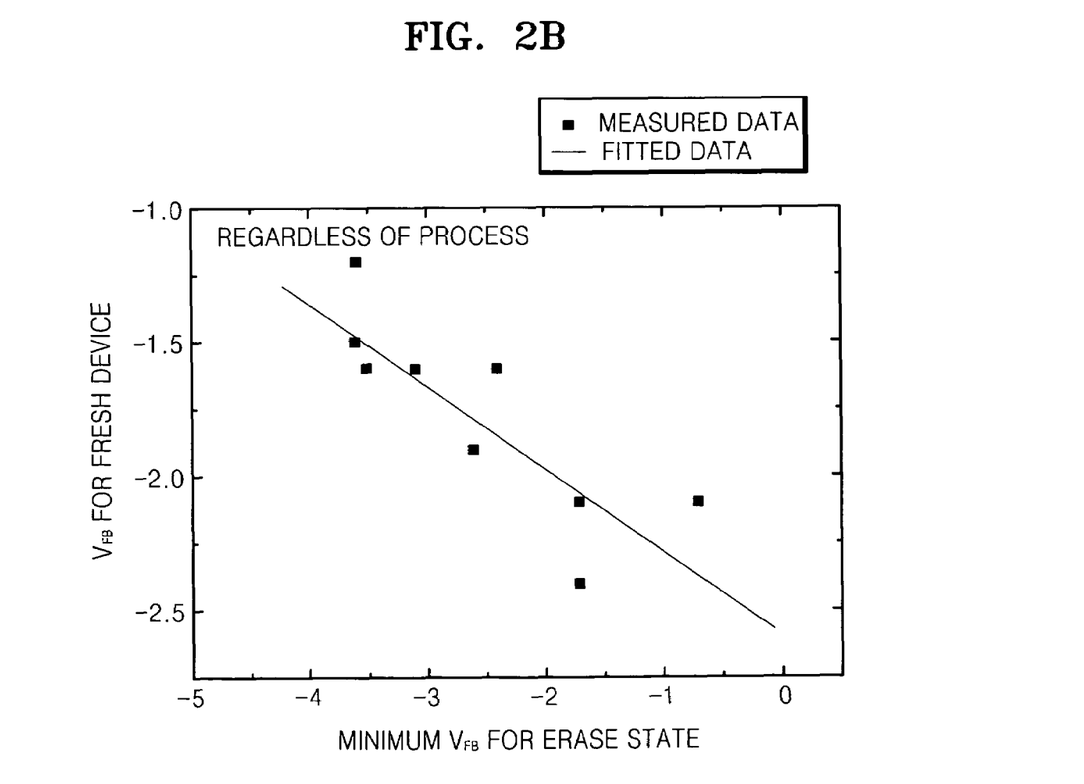
FIG. 2B is a graph showing the relationship between an initial stage flat band voltage $V_{FB}$ and a minimum flat band voltage $V_{FB}$ when information is erased from a memory device.

FIG. 2B is a graph showing the relationship between an initial stage flat band voltage $V_{FB}$ and a minimum flat band voltage $V_{FB}$ when information is erased from a memory device. In a charge trapping memory device, as the flat band voltage $V_{FB}$ increases, the retention characteristics are improved. To erase information from a memory device, a large negative voltage is applied to the gate electrode layer 25. During the information erasing process, the minimum flat band voltage may have a large negative value. That is, the minimum flat band voltage may have values in the upper left side in FIG. 2B. A voltage $V_g$ applied to the gate electrode layer 25, a flat band voltage $V_{FB}$, and a voltage $V_{ox}$ actually applied to the blocking oxide layer 24 have the following relationship.

$$V_g = V_{FB} + V_{ox}$$ [Equation 1]

The flat band voltage is proportional to $-Q_f/C_{ox}$. Here, $Q_f$ is a charge value of the blocking oxide layer 24, and $C_{ox}$ is the capacitance of the oxide film. In the erasing process, a voltage applied to the gate electrode layer 25 has a large negative value and a voltage actually applied to the blocking oxide layer 24 varies according to the flat band voltage $V_{FB}$. As it is seen from equation 1, when the flat band voltage $V_{FB}$ has a positive value, the voltage applied to the blocking oxide layer 24 has a large negative value.

Accordingly, to allow the flat band voltage to have a positive value, the blocking oxide layer 24 can have a negative fixed oxide charge.

When the blocking oxide layer 24 has a negative fixed oxide charge, the band gap energy of the blocking oxide layer 24 is increased. The increased band gap energy of the blocking oxide layer 24 prevents the migration of charge from the gate electrode layer 25 to the charge storing layer 23 by tunneling through the blocking oxide layer 24, that is, the back tunneling of charge. Back tunneling can occur during an erasing process. Therefore, the electrical characteristics of the memory device are greatly improved when the blocking oxide layer 24 has the negative fixed oxide charge.

A method of manufacturing a memory device as depicted in FIG. 2A, having improved erasing characteristics, according to an embodiment of the present invention will now be described with reference to FIGS. 3A through 3C. In the present invention, to manufacture the memory device, PVD, CVD, chemical doping, coating, ion implanting, annealing and rapid temperature annealing (RTA) processes can be used.

Figure 3A:
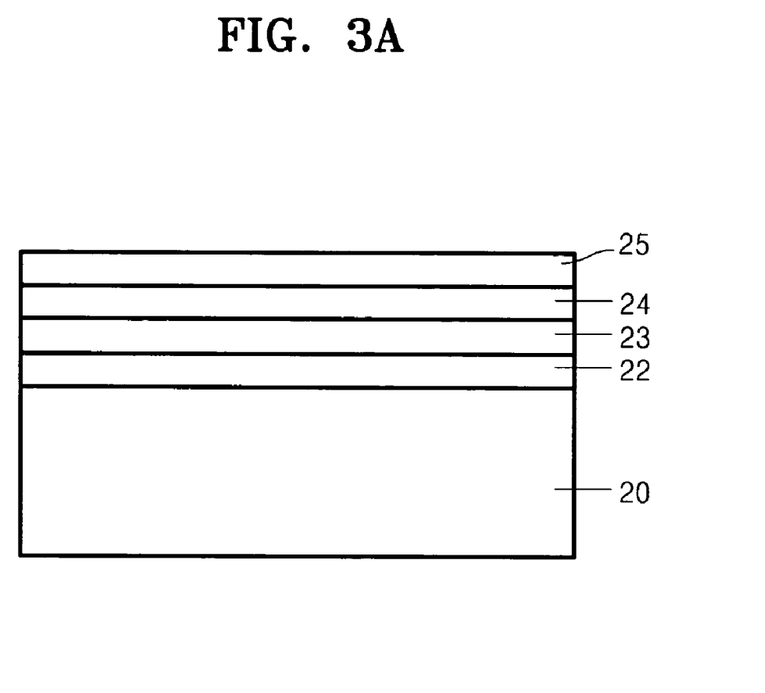
FIGS. 3A through 3C are cross-sectional views illustrating a method of manufacturing a memory device having improved erasing characteristics according to an embodiment of the present invention.

Referring to FIG. 3A, a semiconductor substrate 20 is prepared. The semiconductor substrate 20 can be formed of any material used for manufacturing a conventional semiconductor memory device, including Si. A tunneling oxide layer 22 is deposited on the semiconductor substrate 20. The tunneling oxide layer 22 can be formed to a thickness of approximately 2 to 4 nm by depositing an insulating material such as $SiO_2$ using a conventional semiconductor manufacturing process. After the tunneling oxide layer 22 is formed, a charge storing layer 23 is deposited on the tunneling oxide layer 22. The charge storing layer 23 can be formed of a high-k material having a high dielectric constant.

Next, a blocking oxide layer 24 is deposited on the charge storing layer 23. The blocking oxide layer 24 can be formed to a thickness of 3.5 to 20 nm using a dielectric material, such as $SiO_2$ or $Al_2O_3$. When the blocking oxide layer 24 is deposited, a rapid thermal annealing (RTA) process is performed at a temperature of, 650° C. or more in a chamber filled with an atmospheric gas that includes an element selected from the group consisting of N, O, F, Si, P, S, Cl, C, As, Se, Br, Te, I, and At so that the blocking oxide layer 24 can have a negative fixed oxide charge. More specifically, the RTA process may be performed at a temperature in the range of 700 to 1000° C.

In one embodiment, the atmospheric gas can be, for example, $O_2$ gas, $NH_3$ gas, or RuO gas. The pressure of the atmospheric gas is not an important factor, and can be controlled as necessary. In this manner, oxygen or nitrogen allows the blocking oxide layer 24 to have a negative fixed oxide charge. However, when $N_2$ gas or $N_2O$ gas is injected into the chamber, the negative fixed oxide charge of the blocking oxide layer 24 is not readily attained. Therefore, when nitride must be included in the blocking oxide layer 24, the atmospheric gas is preferably $NH_3$ gas.

Next, a gate electrode layer 25 is formed on the blocking oxide layer 24. The gate electrode layer 25 can be formed of a conductive material used for manufacturing a conventional semiconductor memory device.

Figure 3B:
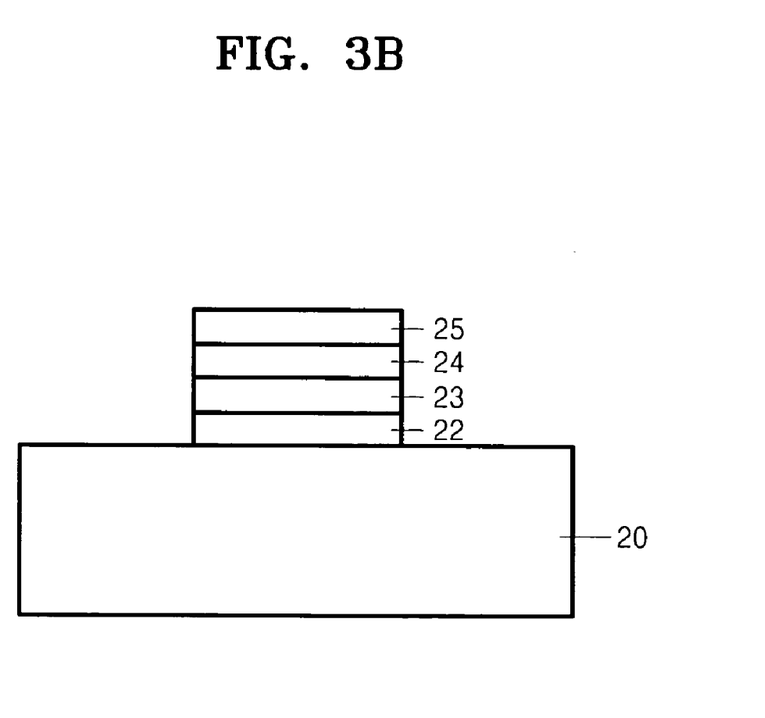
Figure 3C:
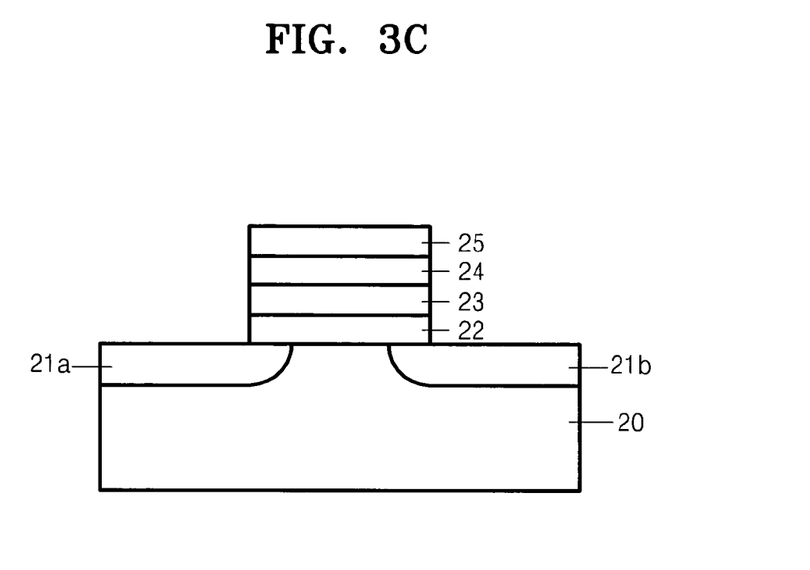

Referring to FIGS. 3B and 3C, upper surfaces of the semiconductor substrate 20 on sides of the gate structure are exposed by etching both sides of the tunneling oxide layer 22, the charge storing layer 23, the blocking oxide layer 24, and the gate electrode layer 25. The exposed upper surfaces of the semiconductor substrate 20 are doped with a dopant. As the result of doping, a first doped region 21a and a second doped region 21b are formed in the semiconductor substrate 20. Finally, the first doped region 21a and the second doped region 21b are activated by annealing the resultant product.

In the method of manufacturing the memory device described with reference to FIGS. 3A through 3C above, the process for allowing the blocking oxide layer 24 to have the negative fixed oxide charge is performed immediately after forming the blocking oxide layer 24 on the charge storing layer 23; however, the present invention is not limited thereto. That is, in another embodiment, the negative fixed oxide charge of the blocking oxide layer 24 can be selectively attained by penetrating oxide or nitride, or another element or gas that results in the blocking oxide layer having a negative field oxide layer, through lateral side portions of the blocking oxide layer 24 after the gate is etched and the first doped region 21a and the second doped region 21b are formed.

Figure 4:
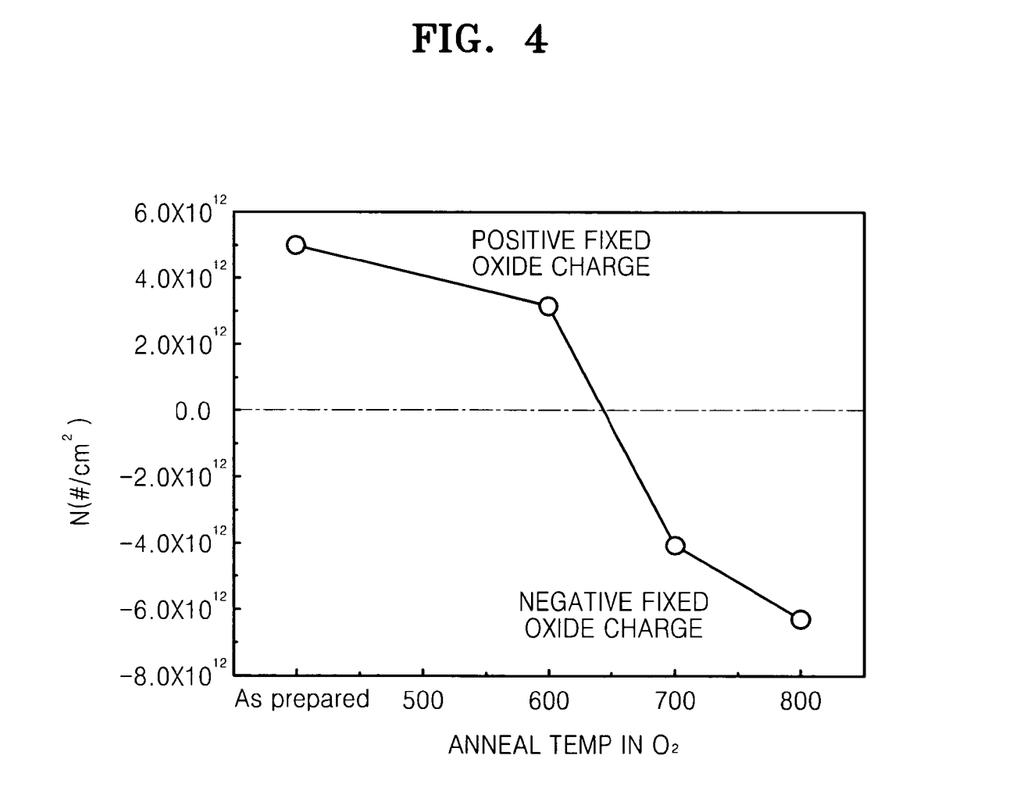
FIG. 4 is a graph showing erasing and retention characteristics of a memory device according to an embodiment of the present invention.

FIG. 4 is a graph showing charge values of a memory device according to annealing temperatures of a specimen manufactured by the processes described with reference to FIGS. 3A through 3C. Here, the x axis represents an annealing temperature under an $O_2$ atmosphere, and the y axis represents $N_f(Q_f/Q)$ values.

Referring to FIG. 4, when the specimen is annealed at a temperature of 650° C. or more, it is seen that the blocking oxide layer 24 readily attains the desired negative fixed oxide charge.

Figure 5A:
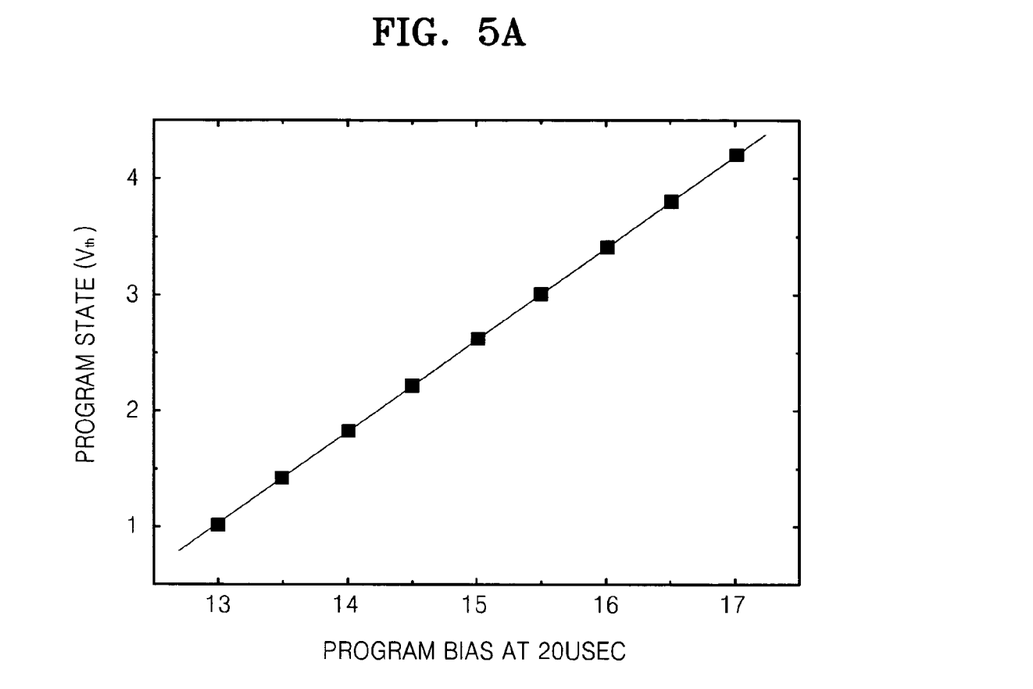
FIGS. 5A through 5C are graphs showing electrical characteristics of a memory device according to an embodiment of the present invention.
Figure 5B:
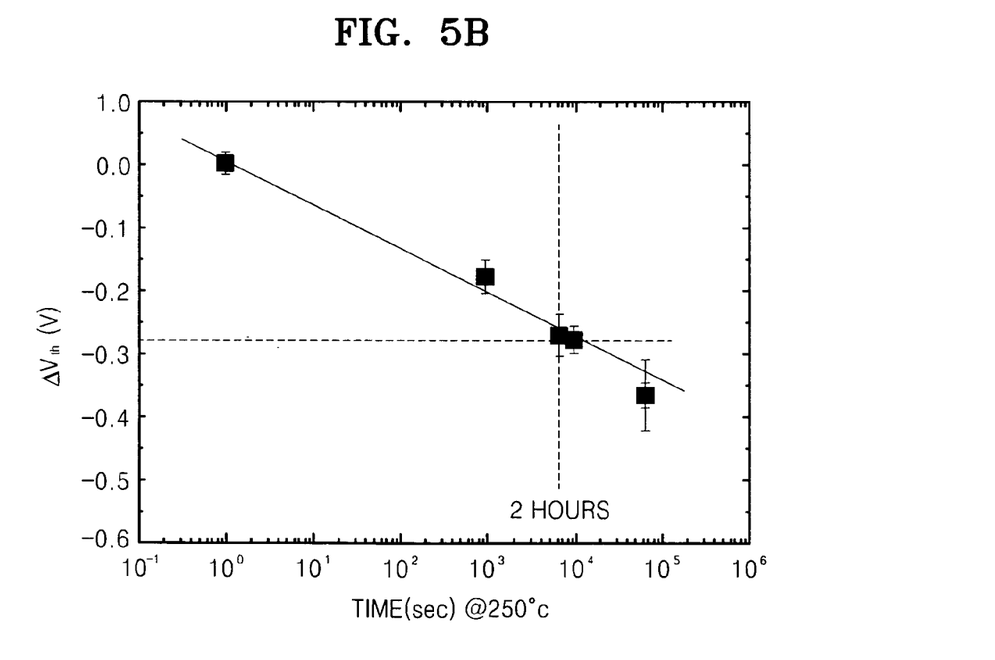
Figure 5C:
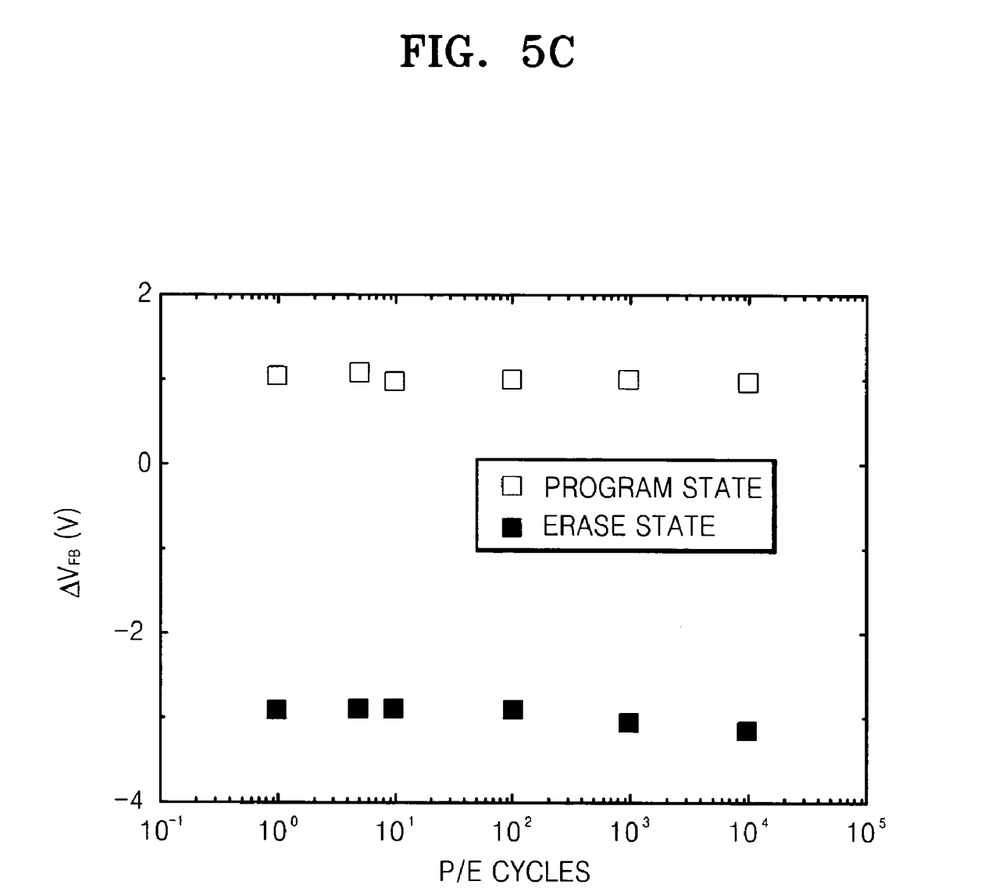

FIGS. 5A through 5C are graphs showing electrical characteristics of a memory device having improved erasing characteristics according to an embodiment of the present invention.

Referring to FIG. 5A, if a bias voltage of 13 to 17 V is applied to the specimen when information is programmed, the threshold voltage $V_{th}$ at the programming state increases to greater than 1 V. Accordingly, the specimen can be used as a memory device.

Referring to FIG. 5B, if a memory device is used for 10 years at a temperature of 85° C. after the memory device is annealed for two hours at a temperature of 250° C., the estimated threshold voltage $V_{th}$ shows a very small change of about −0.3V or more.

FIG. 5C shows the results of measuring flat band voltages $V_{FB}$ by performing programming/erasing (P/E) cycles. Referring to FIG. 5C, the flat band voltages $V_{FB}$ of programming and erasing are substantially unchanged after $10^4$ P/E cycles.

While this invention has been particularly shown and described with references to preferred embodiments thereof, it will be understood by those skilled in the art that various changes in form and details may be made herein without departing from the spirit and scope of the invention as defined by the appended claims.

For example, the present invention can be applied to all charge trapping type memory devices that include a SONOS memory device.

According to the present invention, the stability of erasing characteristics of a memory device can be enhanced by forming a blocking oxide layer of a charge trapping type semiconductor memory device to have a negative fixed oxide charge.

Also, by forming the blocking oxide layer to have a negative fixed oxide charge, the band gap energy of the blocking oxide layer can be increased. The increase in the band gap energy of the blocking oxide layer prevents back tunneling of charge from the gate electrode layer to the blocking oxide layer.

What is claimed is:

1. A method of manufacturing a memory device, comprising:
    sequentially forming a tunneling oxide layer, a charge storing layer, and a blocking oxide layer on a semiconductor substrate;
    annealing the semiconductor substrate including the tunneling oxide layer, the charge storing layer, and the blocking oxide layer under a gas atmosphere and at a temperature so that the blocking oxide layer has a negative fixed oxide charge;
    forming a gate electrode on the blocking oxide layer with the negative fixed oxide charge and etching the tunneling oxide layer, the charge storing layer, and the blocking oxide layer to form a gate structure; and
    forming a first doped region and a second doped region in the semiconductor substrate at sides of the gate structure by doping the semiconductor substrate with a dopant.

2. The method of claim 1, wherein the gas atmosphere for annealing comprises an element selected from the group consisting of N, O, F, Si, P, S, Cl, C, As, Sc, Br, Te, I, and At.

3. The method of claim 1, wherein the gas atmosphere for annealing is one selected from $O_2$, RuO, and $NH_3$.

4. The method of claim 1, wherein the annealing is performed at a temperature of 650° C. or more.

5. The method of claim 4, wherein the annealing is performed at a temperature in the range of 700 to 1000° C.

6. A method of manufacturing a memory device, comprising:
    sequentially forming a tunneling oxide layer, a charge storing layer, a blocking oxide layer, and a gate electrode layer on a semiconductor substrate;
    etching the tunneling oxide layer, the charge storing layer, the blocking oxide layer, and the gate electrode layer to form a gate structure;
    forming a first doped region and a second doped region in the semiconductor substrate at sides of the gate structure by doping the semiconductor substrate with a dopant; and annealing the semiconductor substrate and the gate structure under a gas atmosphere and at a temperature so that the blocking oxide layer has a negative fixed oxide charge.

7. The method of claim 6, wherein the gas atmosphere for annealing comprises an element selected from the group consisting of N, O, F, Si, P, S, Cl, C, As, Se, Br, Te, I, and At.

8. The method of claim 6, wherein the gas atmosphere for annealing is one selected from $O_2$, RuO, and $NH_3$.

9. The method of claim 6, wherein the annealing is performed at a temperature of 650° C. or more.

10. The method of claim 9, wherein the annealing is performed at a temperature in the range of 700 to 1000° C.

* * * * *